United States Patent
Holaday et al.

(10) Patent No.: US 6,895,536 B2
(45) Date of Patent: May 17, 2005

(54) TESTABLE UP DOWN COUNTER FOR USE IN A LOGIC ANALYZER

(75) Inventors: David A. Holaday, Cornelius, OR (US); Gary K. Richmond, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 408 days.

(21) Appl. No.: 10/253,620

(22) Filed: Sep. 23, 2002

(65) Prior Publication Data

US 2003/0070125 A1 Apr. 10, 2003

Related U.S. Application Data

(60) Provisional application No. 60/326,495, filed on Oct. 1, 2001.

(51) Int. Cl.[7] .......................... G06F 12/00; H02H 3/05; H03K 19/03
(52) U.S. Cl. ...................... 714/706; 714/724; 714/33; 714/39
(58) Field of Search .................. 714/706, 704, 714/724, 733, 741, 742, 738, 745, 33, 38, 37, 39, 48, 49, 50, 51; 712/227; 703/13, 14, 15, 16

(56) References Cited

U.S. PATENT DOCUMENTS

| | | | |
|---|---|---|---|
| 6,128,754 A | * | 10/2000 | Graeve et al. ................ 714/39 |
| 6,377,065 B1 | * | 4/2002 | Le et al. ...................... 324/765 |
| 6,526,501 B2 | * | 2/2003 | Edwards et al. ............ 712/227 |

* cited by examiner

*Primary Examiner*—Christine T. Tu
(74) *Attorney, Agent, or Firm*—Thomas F. Lenihan

(57) ABSTRACT

A logic analyzer according to the subject invention employs a bi-directional counter that can be incremented in response to detection of certain events, and decremented in response to detection of other, different, events. Both an overflow (incremented to a predetermined count) and an underflow (decremented to a predetermined count) can be tested by a trigger machine of the Logic Analyzer.

4 Claims, 2 Drawing Sheets

TESTABLE UP DOWN COUNTER FOR USE IN A LOGIC ANALYZER

CLAIM FOR PRIORITY

The subject application claims priority from U.S. Provisional Patent Application Ser. No. 60/326,495 TESTABLE UP DOWN COUNTER FOR USE IN A LOGIC ANALYZER (David A. Holaday, et al.), filed 1 Oct. 2001.

FIELD OF THE INVENTION

The subject application generally concerns a counter for use in a test and measurement instrument, such as a logic analyzer, or the like, and specifically concerns a bi-directional counter for use in such an instrument.

BACKGROUND OF THE INVENTION

Engineers use Logic Analyzers to acquire digital data from a system under test to aid the engineer to troubleshoot problems that may be occurring in the system under test. A logic analyzer is an invaluable tool to those engineers working on computer systems because of the ability of Logic Analyzers to acquire address, clock, and data information simultaneously over a very large number of input lines.

Unfortunately, a problem arises when a user wants use a logic analyzer to troubleshoot the operation of a memory stack in a system under test, as will be described below. Before describing the details of this problem, a brief review of memory stacks may be helpful.

A "stack" is a defined array of memory locations used for temporary data storage. Initially, the stack is "empty" (i.e., contains no data). A "stack pointer" is initially pointed, for example, to the bottommost memory location of the stack. Storing data to a stack is called "pushing the data onto the stack", and reading data from a stack is called "popping data from the stack". When data is pushed onto a stack, the data is stored in the memory location currently pointed-to by the stack pointer, and thereafter, the stack pointer is incremented to point to the next higher memory location. Thus, the stack "grows" from the bottom up. When data is popped from a stack, the stack pointer is decremented to point to the next lower memory location, and thereafter, the data is read from the memory location currently pointed-to by the stack pointer. Thus, the stack pointer always points to the available storage location at the top of the stack For purposes of explanation, assume that upon detection of a certain event, information in the form of data gets "pushed" onto the stack, and that the detection of a different event causes information to be "popped" from the stack. If all goes well, the stack will grow and shrink within its defined bounds.

Unfortunately, due to an error condition, more information can be pushed onto a stack than it can hold, thus causing the stack to overflow and overwrite data in a higher adjacent memory array. Conversely, and also due to an error condition, more information can be popped from a stack than was pushed onto it, thus causing the stack to underflow and read from a lower adjacent memory array.

The above-mentioned problem is that current logic analyzers allow testing of only one of the two modes of incorrect stack operation. The reason for this inability to test both modes is as follows. Modern logic analyzers generally contain one or more counters that can be used to count incoming events. A trigger machine in such a logic analyzer allows the testing of these counters to determine if a pre determined count value has been reached. Unfortunately, the counters used in current logic analyzers count in one direction only. One might think that an up counter may be used to count events that lead to an overflow condition, and that a down counter may be used to count events leading to an underflow condition. Unfortunately, since the counters are not related to each other, such an attempt would produce meaningless counts in both counters. That is, the up counter has no knowledge of the number of number of times that the down counter has been decremented, and vice versa, thus neither counter would contain a count that reflects the true position of the stack pointer.

SUMMARY OF THE INVENTION

A logic analyzer according to the subject invention employs a bi-directional counter that can be incremented in response to detection of certain events, and decremented in response to detection of other, different, events. Both an overflow (incremented to a predetermined count) and an underflow (decremented to a predetermined count) can be tested by a trigger machine of the Logic Analyzer.

DETAILED DESCRIPTION OF THE EMBODIMENTS

Figure 1:
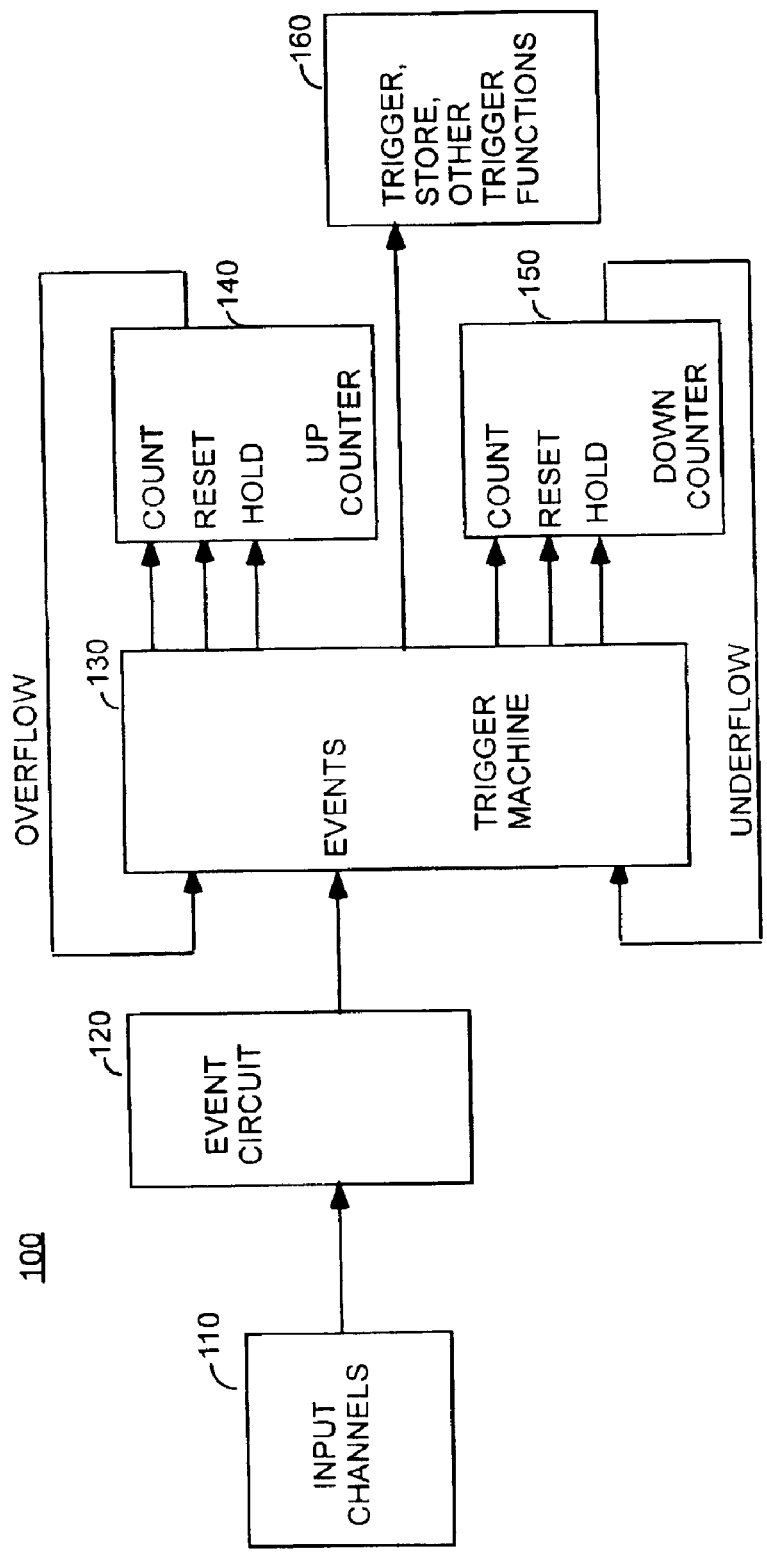
FIG. 1 is a simplified block diagram of a trigger portion of a logic analyzer as known from the prior art.

Referring to FIG. 1, a Logic Analyzer 100, as known from the prior art, includes an Input Channels block 110 for acquiring data from a system under test. Acquired data is passed to an Event Detect circuit 120 that detects, for example, "push-to-stack" and "pop-from-stack" instructions that may be conveyed over a digital data bus on a system under test. Event Detect circuit 120 may contain Word Recognizers, Range Recognizers, Transition Detectors, and/or other hardware circuitry which determines if any specified conditions occurred. In this example, Event Detect circuit 120 produces signals representative of the detection of the acquired "push" and "pop" instruction data, and applies those signals to a Trigger Machine 130 via event lines (shown in FIG. 1 as a single event line for simplicity). Trigger Machine 130 monitors the event lines and peformsa a variety of functions (shown in a function block 160) in response thereto. Trigger Machine 130 controls plurality of counters, only two of which are illustrated in FIG. 1. Counter 140 is an up counter, and counter 150 is a down counter. Trigger machine 130 monitors the overflow indication line from counter 140 and the underflow indication line from counter 150, and takes appropriate action in response to these signals. It is important to note that one cannot change the direction of counting in either of counters 140 or 150.

Table 1 shows the problem by Way of an example involving randomly interleaved push and pop operations on a five-byte stack having memory locations 0 through 4. Assume that at step 0, the up counter 140 is initialized with a value of 0, down counter 150 is initialized with a value of 4, and the stack pointer in the system under test is actually pointing to memory location 0. The overflow of up counter 140 is set to a value of 5 (i.e. one greater than the highest stack address). The underflow of down counter 150 is set to −1 (i.e., one less than the lowest stack address). Note that the only available commands for controlling counters 140 and 150 are count, reset and hold.

TABLE 1

| Step # | Acquired Instruction Data | Up counter Contents | Down counter Contents | Actual Stack Pointer Value |
| --- | --- | --- | --- | --- |
| 0 | none | 0 | 4 | 0 |
| 1 | push | 1 | 4 | 1 |
| 2 | push | 2 | 4 | 2 |
| 3 | push | 3 | 4 | 3 |
| 4 | pop | 3 | 3 | 2 |
| 5 | pop | 3 | 2 | 1 |
| 6 | push | 4 | 2 | 2 |
| 7 | pop | 4 | 1 | 1 |
| 8 | push | 5 Overflow | 2 | 2 |

Note that in the eighth step, up counter 140 incorrectly indicates that the stack pointer has overflowed, while in fact, the stack pointer is actually pointing to a valid stack memory location (i.e., memory location 2).

Figure 2:
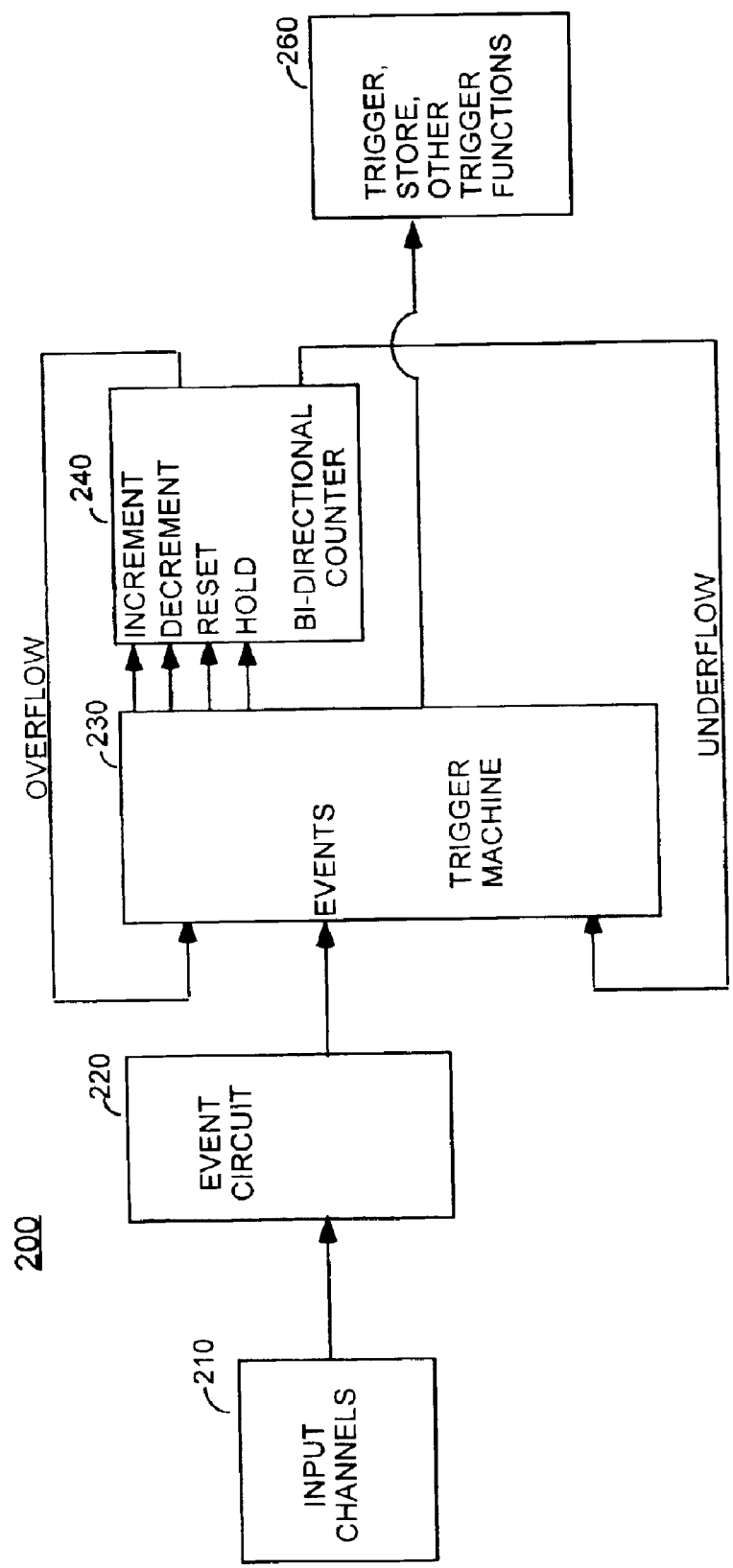
FIG. 2 is a simplified block diagram of a trigger portion of a logic analyzer in accordance with the subject invention.

The subject invention will now be described with reference to FIG. 2 and Table 2. Similar reference numbers in FIGS. 2 and 3 serve similar functions, and need not be described again. Note that counter 240 is a bi-directional counter, capable of being incremented and decremented.

Assume that at step 0 of Table 2, bi-directional counter 240 is initialized with a value of 0, and the stack pointer in the system under test is actually pointing to memory location 0. The overflow of counter 240 is set to a value of 5 (i.e., one greater than the highest stack address), and its underflow is set to −1 (i.e., one less than the lowest stack address). Note that the only available commands for controlling counters 140 and 150 are count, reset and hold. The available commands for controlling bi-directional counter 240 are increment, decrement, reset, and hold. Table 2 shows that the operation of bi-directional counter 240 exactly matches that of the stack pointer. Thus, the count of bi-directional counter 240 mimics the address of the stack pointer of the system under test.

TABLE 2

| Step # | Acquired Instruction Data | Bi-directional counter Contents | Actual Stack Pointer Value |
| --- | --- | --- | --- |
| 0 | none | 0 | 0 |
| 1 | push | 1 | 1 |
| 2 | push | 2 | 2 |
| 3 | push | 3 | 3 |
| 4 | pop | 2 | 2 |
| 5 | pop | 1 | 1 |
| 6 | push | 2 | 2 |
| 7 | pop | 1 | 1 |
| 8 | push | 2 | 2 |

Note that unlike the prior art counters, the decrement function of the subject invention operates on the same value in counter 240 that the increment function operates on. Thus, if the very first instruction received is a pop-from-stack instruction, then bi-directional counter 240 will correctly indicate an underflow condition.

What has been described is an arrangement using a bi-directional counter for testing both modes of the above-described problem at the same time. It is important to remember that such testing has heretofore not been possible with a logic analyzer.

Although discrete logic has been shown in the FIGURES, one skilled in the art will realize that all of the logic circuits can be realized in an ASIC or programmed into an FPGA, and both of these modifications are deemed to lie within the scope of the following claims.

What is claimed is:

1. A logic analyzer, comprising:

an acquisition circuit for acquiring digital data from a system under test;

an event detector for detecting a plurality of events including a first event and a second event in said acquired digital data;

a trigger machine for performing ones of a plurality of functions in response to ones of said plurality of events; and a bi-directional counter for counting up in response to a first signal generated by said trigger machine and for counting down in response to a second signal generated in by said trigger machine;

said bi-directional counter providing overflow and underflow signals to said trigger machine.

2. The logic analyzer of claim 1, wherein said first event is a detection of a push-to-stack instruction in said acquired digital data from said system under test; and said second event is a detection of a pop-from-stack instruction in said acquired digital data from said system under test; and said bi-directional counter holds a value that maintains a fixed relationship to a value in a stack pointer of said system under test.

3. The use of a bi-directional counter in a logic analyzer for mimicking a stack pointer in a system under test, said logic analyzer comprising:

an acquisition circuit for acquiring digital data from a system under test;

an event detector for detecting a plurality of events including a first event and a second event in said acquired digital data;

a trigger machine for performing ones of a plurality of functions in response to ones of said plurality of events; and said bi-directional counter for counting up in response to a first signal generated by said trigger machine and for counting down in response to a second signal generated in by said trigger machine;

said bi-directional counter providing overflow and underflow signals to said trigger machine.

4. The use of a bi-directional counter in a logic analyzer according to claim 3, wherein said first event is a detection of a push-to-stack instruction in said acquired digital data from said system under test; and said second event is a detection of a pop-from-stack instruction in said acquired digital data from said system under test; and said bi-directional counter holds a value that maintains a fixed relationship to a value in a stack pointer of said system under test.

* * * * *